United States Patent
Yang et al.

(10) Patent No.: US 10,510,980 B2
(45) Date of Patent: Dec. 17, 2019

(54) DISPLAY MODULE

(71) Applicant: Samsung Display Co., Ltd., Yongin-si, Gyeonggi-do (KR)

(72) Inventors: Taehoon Yang, Yongin-si (KR); Jaewan Jung, Hwaseong-si (KR); Kiyong Lee, Cheonan-si (KR); Sangwol Lee, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 103 days.

(21) Appl. No.: 14/983,460

(22) Filed: Dec. 29, 2015

(65) Prior Publication Data
US 2016/0307973 A1    Oct. 20, 2016

(30) Foreign Application Priority Data
Apr. 16, 2015  (KR) .................. 10-2015-0053972

(51) Int. Cl.
G09G 1/00      (2006.01)
H01L 51/52     (2006.01)
G06F 1/16      (2006.01)

(52) U.S. Cl.
CPC ........ H01L 51/5237 (2013.01); G06F 1/1643 (2013.01); H01L 2251/5338 (2013.01)

(58) Field of Classification Search
CPC .............. G06F 1/1643; G06F 3/041; G06F 2203/04102; G06F 3/0412; G09G 3/30; G09G 3/36; H01L 27/32; H01L 51/56
See application file for complete search history.

(56) References Cited

U.S. PATENT DOCUMENTS

| | | | |
|---|---|---|---|
| 8,853,941 B2 | 10/2014 | Jung | |
| 8,928,580 B2 | 1/2015 | Hwang et al. | |
| 2011/0234525 A1 | 9/2011 | Gettemy et al. | |
| 2012/0287066 A1* | 11/2012 | Yang | G06F 1/1626 345/173 |
| 2014/0126228 A1* | 5/2014 | Lee | H05K 5/0017 362/382 |
| 2014/0132488 A1* | 5/2014 | Kim | H01L 51/52 345/76 |
| 2014/0217382 A1* | 8/2014 | Kwon | H01L 51/0097 257/40 |
| 2014/0289668 A1* | 9/2014 | Mavrody | G06F 3/04886 715/781 |
| 2015/0173212 A1 | 6/2015 | Lee et al. | |
| 2015/0379964 A1* | 12/2015 | Lee | G09G 5/12 345/173 |

FOREIGN PATENT DOCUMENTS

| | | |
|---|---|---|
| CN | 102055821 A | 5/2011 |
| CN | 103824525 A | 5/2014 |

(Continued)

*Primary Examiner* — Michael A Faragalla
(74) *Attorney, Agent, or Firm* — Lewis Roca Rothgerber Christie LLP

(57) ABSTRACT

A display module includes a window member including a display area and a bezel area, a display panel including a display part corresponding to the display area, and an edge part corresponding to the bezel area and bent from the display part to extend away from the window member, and a protective frame accommodating the display panel and coupled to the window member.

21 Claims, 16 Drawing Sheets

(56) References Cited

FOREIGN PATENT DOCUMENTS

| | | |
|---|---|---|
| JP | 5206953 B2 | 6/2013 |
| JP | 5444940 B2 | 3/2014 |
| JP | 5644075 B2 | 12/2014 |
| KR | 10-1320384 B1 | 10/2013 |
| KR | 10-1384950 B1 | 4/2014 |
| KR | 10-1441224 B1 | 9/2014 |
| KR | 10-1482629 B1 | 1/2015 |
| KR | 10-1515629 B1 | 4/2015 |
| KR | 10-2015-0071415 A | 6/2015 |

* cited by examiner

DISPLAY MODULE

CROSS-REFERENCE TO RELATED APPLICATION

This patent application claims priority to and the benefit of Korean Patent Application No. 10-2015-0053972, filed on Apr. 16, 2015, the contents of which are hereby incorporated by reference in its entirety.

BACKGROUND

1. Field

The present disclosure relates to a display module, and more particularly, to a partially bent display module.

2. Description of the Related Art

In recent years, various types of display devices applied to a multi-media device, e.g., a television set, a mobile phone, a navigation system, a computer monitor, a game device, etc., have been developed. The display devices provide a user with images that display predetermined information. Each display device includes a display area in which the images are displayed, and a non-display area (hereinafter, referred to as a bezel area) in which no images are displayed. The display area for displaying the image increases as the bezel area decreases.

SUMMARY

The present disclosure provides a display module having a reduced bezel area and reduced defects.

Embodiments of the present invention provide a display module including a window member including a display area and a bezel area, a display panel including a display part corresponding to the display area, and an edge part corresponding to the bezel area and bent from the display part to extend away from the window member, and a protective frame accommodating the display panel and coupled to the window member.

The edge part may includes a first edge part bent from a first side of the display part, and a second edge part opposite the first edge part and bent from a second side of the display part.

The display module may further include a dummy member attached to the display panel and including a flat part corresponding to the display part, a first bending part corresponding to the first edge part, and a second bending part corresponding to the second edge part.

The display panel may include a base layer, a circuit layer on the base layer, a display element layer on the circuit layer, and an encapsulation layer on the display element layer.

Each of the first and second edge parts may include a neutral plane, and the circuit layer at the first and second edge parts may be applied with a compressive stress.

Each of the first and second bending parts may be applied with a tensile stress.

Each of the first and second bending parts may include a neutral plane, and the circuit layer of the first and second edge parts may be applied with a compressive stress.

The circuit layer may include a thin film transistor.

The display element layer may include an organic light emitting diode.

The display module may further include a touch panel between the display panel and the window member.

The display module may further include a support member between the display panel and the protective frame.

Embodiments of the present invention provide a display module including a first window member including a display area and a bezel area, a display panel including a display part corresponding to the display area, and an edge part corresponding to the bezel area and bent from the display part to extend away from the first window member, and a second window member facing the first window member such that the display panel is between the first and second window members.

The edge part may include a first edge part bent from a first side of the display part, and a second edge part opposite the first edge part and bent from a second side of the display part.

The display module may further include a dummy member attached to the display panel and including a flat part corresponding to the display part, a first bending part corresponding to the first edge part, and a second bending part corresponding to the second edge part.

The display panel may include a base layer, a circuit layer on the base layer and including a thin film transistor, a display element layer on the circuit layer and including an organic light emitting diode, and an encapsulation layer on the display element layer.

Each of the first and second edge parts may include a neutral plane, and the circuit layer of the first and second edge parts may be applied with a compressive stress.

Each of the first and second bending parts may include a neutral plane, and the circuit layer of the first and second edge parts may be applied with a compressive stress.

The organic light emitting diode may provide light to the first and second window members.

The display module may further include a first touch panel between the display panel and the first window member.

The display module may further include a second touch panel between the display panel and the second window member.

According to the above, because the edge part is bent from the display part, the bezel area is reduced. Therefore, the display area of the display module may become wider. The display module may display the image in one direction or in bi-directions. In addition, the display module may be transparent.

The dummy member controls the position of the neutral plane generated in the edge part. When the neutral plane is generated in the dummy member or in the encapsulation layer, the compressive stress is applied to the thin film transistor. Thus, the thin film transistor may be prevented from being damaged.

BRIEF DESCRIPTION OF THE DRAWINGS

The above and other aspects of the present disclosure will become readily apparent by reference to the following detailed description when considered in conjunction with the accompanying drawings wherein.

DETAILED DESCRIPTION

Figure 1:
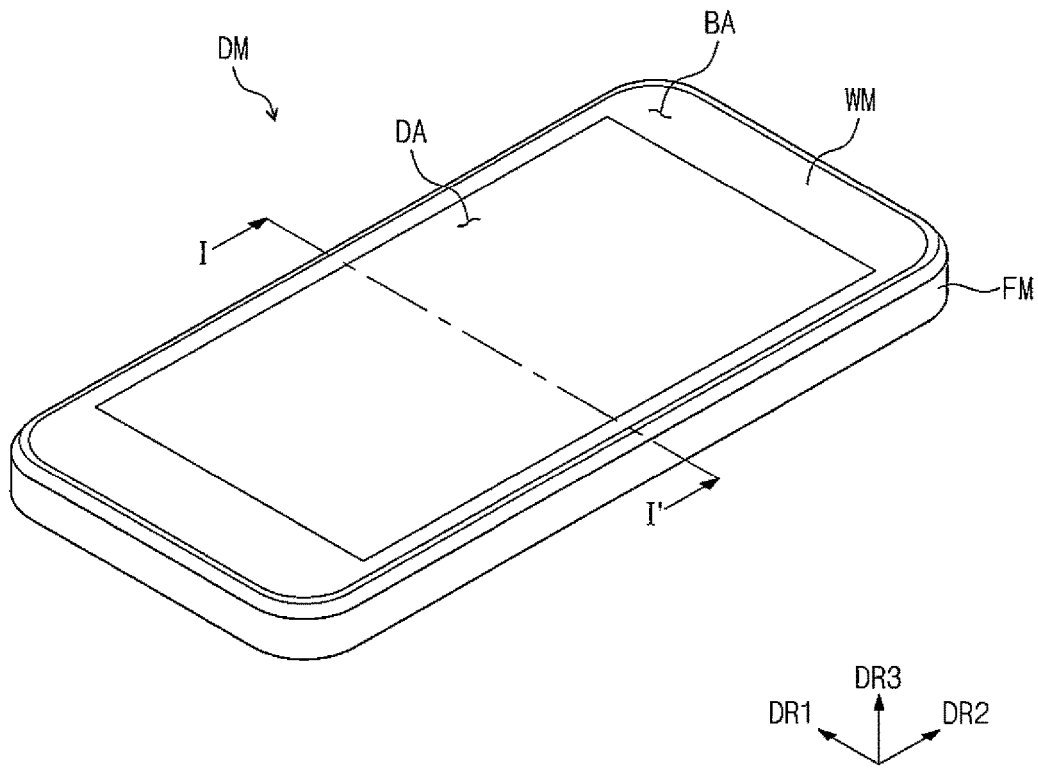
FIG. 1 is a perspective view showing a display module according to an exemplary embodiment of the present disclosure.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, embodiments of the present invention will be explained in detail with reference to the accompanying drawings.

Figure 2:
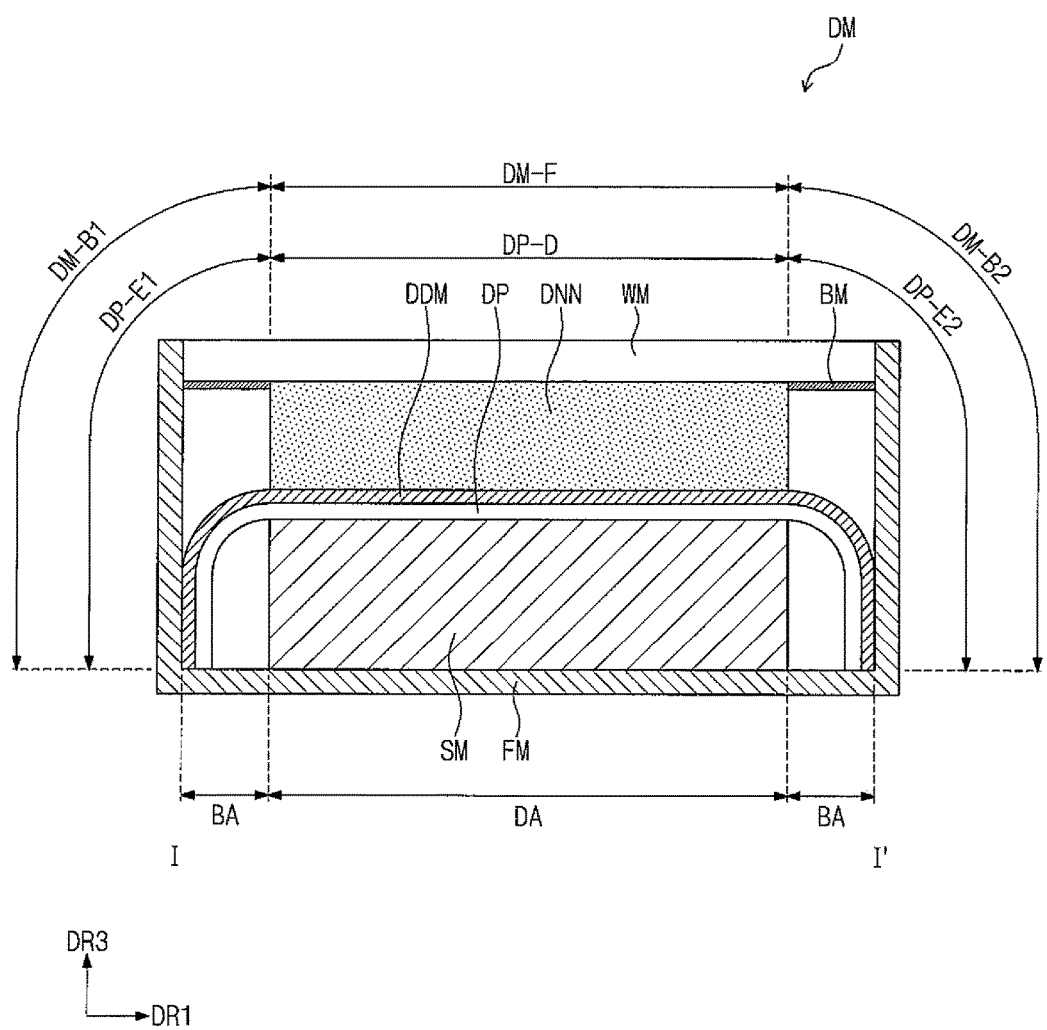
FIG. 2 is a cross-sectional view showing a display module according to an exemplary embodiment of the present disclosure.
Figure 3:
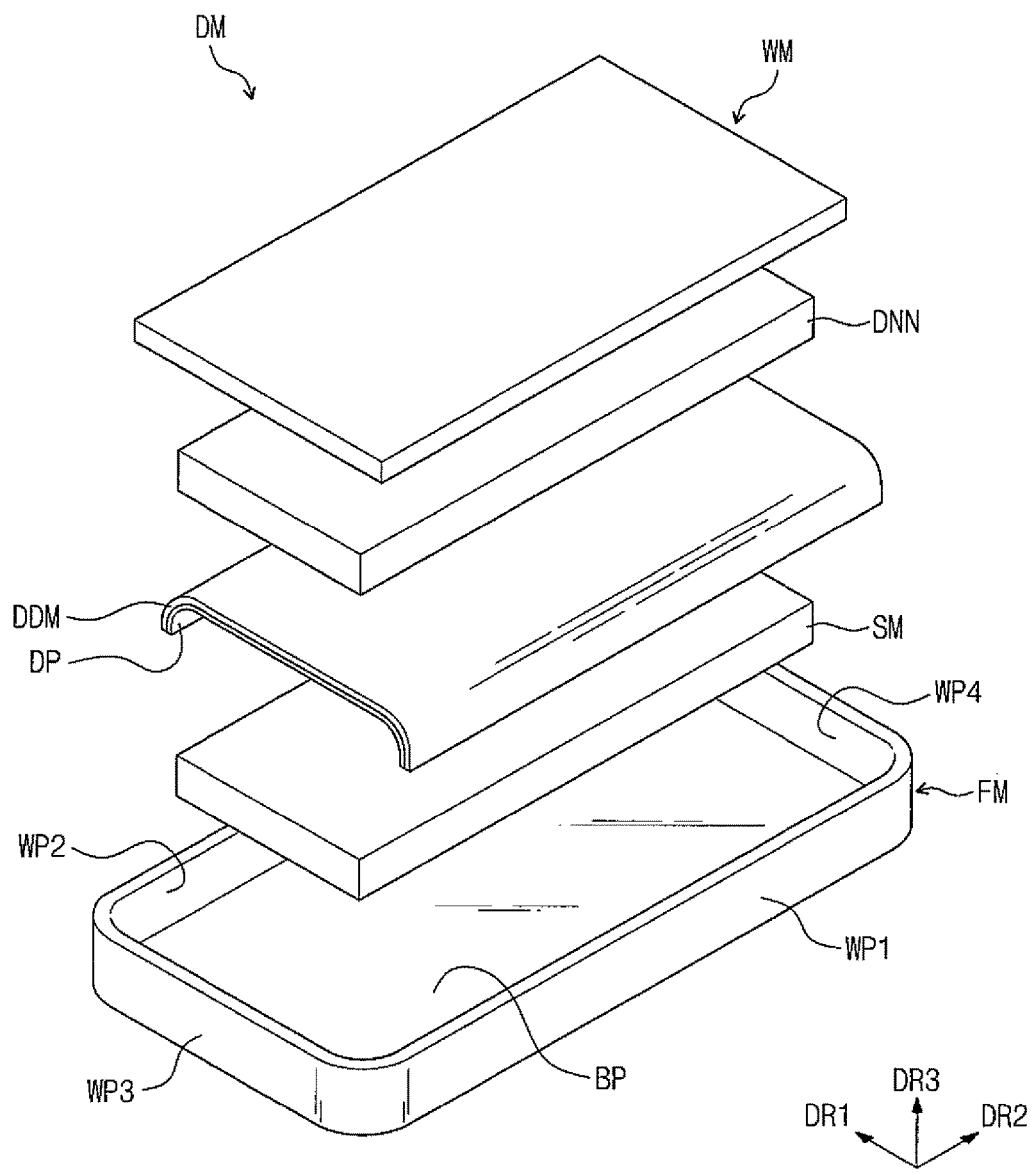
FIG. 3 is an exploded perspective view showing a display module according to an exemplary embodiment of the present disclosure.

FIG. 1 is a perspective view showing a display module DM according to an exemplary embodiment of the present disclosure, FIG. 2 is a cross-sectional view showing the display module DM according to an exemplary embodiment of the present disclosure, and FIG. 3 is an exploded perspective view showing the display module DM according to an exemplary embodiment of the present disclosure.

The display module DM shown in FIGS. 1 to 3 may be applied to a mobile phone. Electronic devices, such as the mobile phone, may further include a main circuit member, a power supply member, and a housing. The main circuit member may include a control module, a wireless communication module, an image input module, a sound input module, a sound output module, and a memory. The power supply member is configured to supply a power voltage required to drive the display module. The housing accommodates at least the main circuit member, and is coupled to the display module DM.

In addition, the display module DM may be applied to a large-sized electronic item (e.g., a television set, an outdoor billboard, etc.), and also to a small-sized or medium-sized electronic item (e.g., a personal computer, a notebook computer, a personal digital assistants, a navigation unit, a game unit, a mobile electronic device, a wrist-type electronic device, a camera, etc.), although the present invention should not be limited thereto or thereby.

Referring to FIG. 1, the display module DM includes a plurality of areas defined on a display surface thereof. The display module DM includes a display area DA in which an image is displayed, and a bezel area BA located adjacent the display area DA. For instance, the display area DA has a substantially quadrangular shape. The bezel area BA surrounds the display area DA. In other words, the bezel area BA corresponds to an edge of the display surface.

Referring to FIGS. 2 and 3, the display module DM includes a window member WM, a functional member DNN, a dummy member DDM, a display panel DP, a support member SM, and a protective frame FM. The support member SM, the display panel DP, the dummy member DDM, the functional member DNN, and the window member WM are sequentially stacked on the protective frame FM in a third direction DR3. In the present exemplary embodiment, one or more of the functional member DNN, the dummy member DDM, and the support member SM may be omitted.

The window member WM corresponds to the display surface of the display module DM and also corresponds to a front surface of the display module DM. The window member WM includes a transparent substrate, e.g., a glass substrate, a plastic substrate, etc. In the present exemplary embodiment, the window member WM has a substantially rectangular plate shape. The shape of the window member WM in a plan view may be changed depending on a design of the display module DM. For example, the window member WM may have a substantially rectangular shape having rounded corners when viewed in a plan view.

The window member WM includes a black matrix layer BM at portions of a rear surface of the window member DM. The area or portions at which the black matrix layer BM is located correspond to the bezel area BA of the display module DM. The black matrix layer BM includes an organic material and/or an inorganic material having a predetermined color. The black matrix layer BM may include a pigment or a dye to represent the predetermined color.

The display panel DP includes a display part DP-D and edge parts DP-E1 and DP-E2 bent from the display part DP-D. The display part DP-D overlaps the display area DA, and is spaced from the rear surface of the window member WM.

The first edge part DP-E1 extends from one side of the display part DP-D, and the second edge part DP-E2 extends from another side of the display part DP-D, which faces the one side of the display part DP-D in a first direction DR1. The first and second edge parts DP-E1 and DP-E2 are bent or curved (e.g., to have a predetermined curvature) to extend away from the window member WM. The first edge part DP-E1 is bent from the one side of the display part DP-D and the second edge part DP-E2 is bent from another side of the display part DP-D.

As described above, the first and second edge parts DP-E1 and DP-E2 are bent from the display part DP-D, and the bezel area BA is reduced. Accordingly, the display module DM has a wider display area and correspondingly has a narrower bezel area.

The display panel DP may be, but is not limited to, an organic light emitting diode display panel, a plasma display panel, a liquid crystal display panel, an electrowetting display panel, an electrophoretic display panel, or a microelectromechanical system display panel (MEMS). In the present exemplary embodiment, the display panel DP will be described as an organic light emitting diode display panel.

The dummy member DDM is attached to an entire surface of the display panel DP, and may be coupled to the display panel DP by an adhesive, e.g., a transparent adhesive sheet. The dummy member DDM may include a transparent plastic film. The dummy member DDM controls stress generated in the first and second edge part DP-E1 and DP-E2. This will be described in detail later.

The dummy member DDM has substantially the same shape as that of the display panel DP, and includes a flat part DM-F corresponding to the display part DP-D, a first bending part DM-B1 corresponding to the first edge part DP-E1, and a second bending part DM-B2 corresponding to the second edge part DP-E2. Each of the first and second bending parts DM-B1 and DM-B2 is bent or curved from the flat part DM-F (e.g., to have a predetermined curvature) to be spaced apart from the window member WM.

The functional member DNN is located between the window member WM and the display panel DP and/or the dummy member DDM. The functional member DNN maintains separation between the display part DP-D of the display panel DP and the window member WM. When viewed in a plan view, the functional member DNN may have substantially the same area as that of the display part DP-D. This is to provide a uniform optical path between the display part DP-D and the window member WM in the display area DA regardless of positioning of the display area DA.

The functional member DNN includes a plastic film, and may include a touch panel or an optical member. The functional member DNN will be described in detail later.

The protective frame FM accommodates the display panel DP, and is coupled to one or more of the rear surface and side surfaces of the window member WM. FIGS. 2 and 3 show the protective frame FM coupled to the side surfaces of the window member WM. The protective frame FM includes a bottom part BP (see FIG. 3) facing the window member WM, a first sidewall part WP1 facing the first edge part DP-, and a second sidewall part WP2 facing the second edge part DP-E2. The protective frame FM may further include third and fourth sidewall parts WP3 and WP4 between the first and second sidewall parts WP1 and WP2.

The protective frame FM may be formed of a plastic or metal material, and may be either transparent or non-transparent. The protective frame FM may be integrally formed as a single unit, or may include a plurality of parts assembled to each other.

The support member SM is located between the protective frame FM and the display panel DP and/or the dummy member DDM, and may be formed of a plastic material. When viewed in a plan view, the support member SM has substantially the same area as that of the display part DP-D. In the present exemplary embodiment, the support member SM may have a shape that supports the rear surface of the bent display panel DP.

Figure 4:
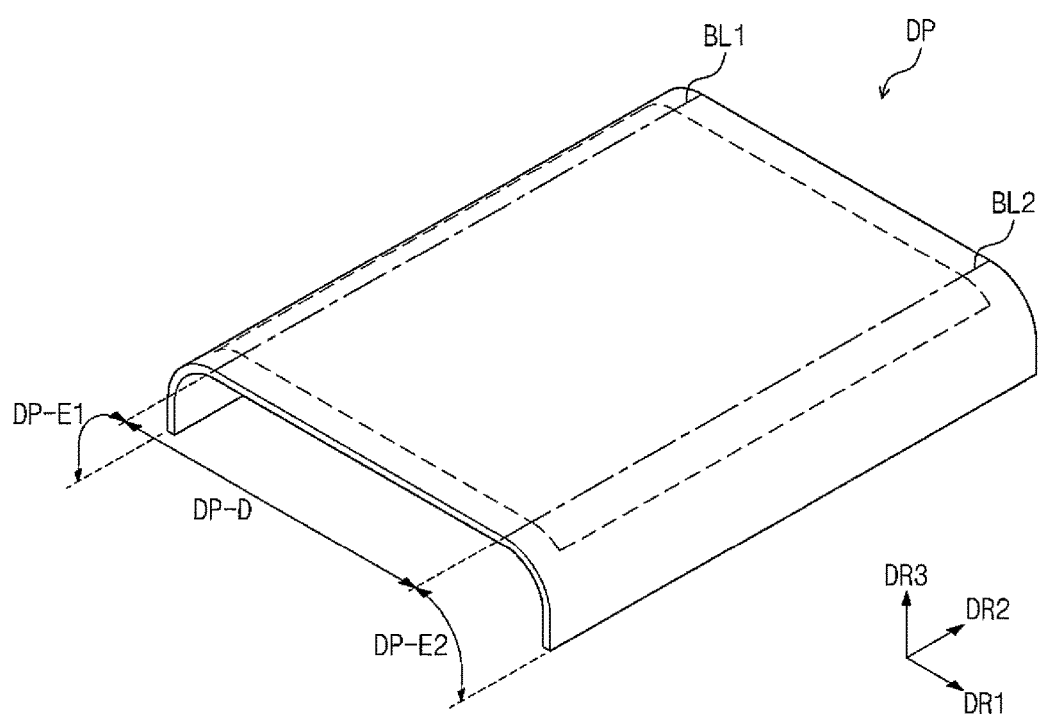
FIG. 4 is a perspective view showing a display panel according to an exemplary embodiment of the present disclosure.
Figure 5:
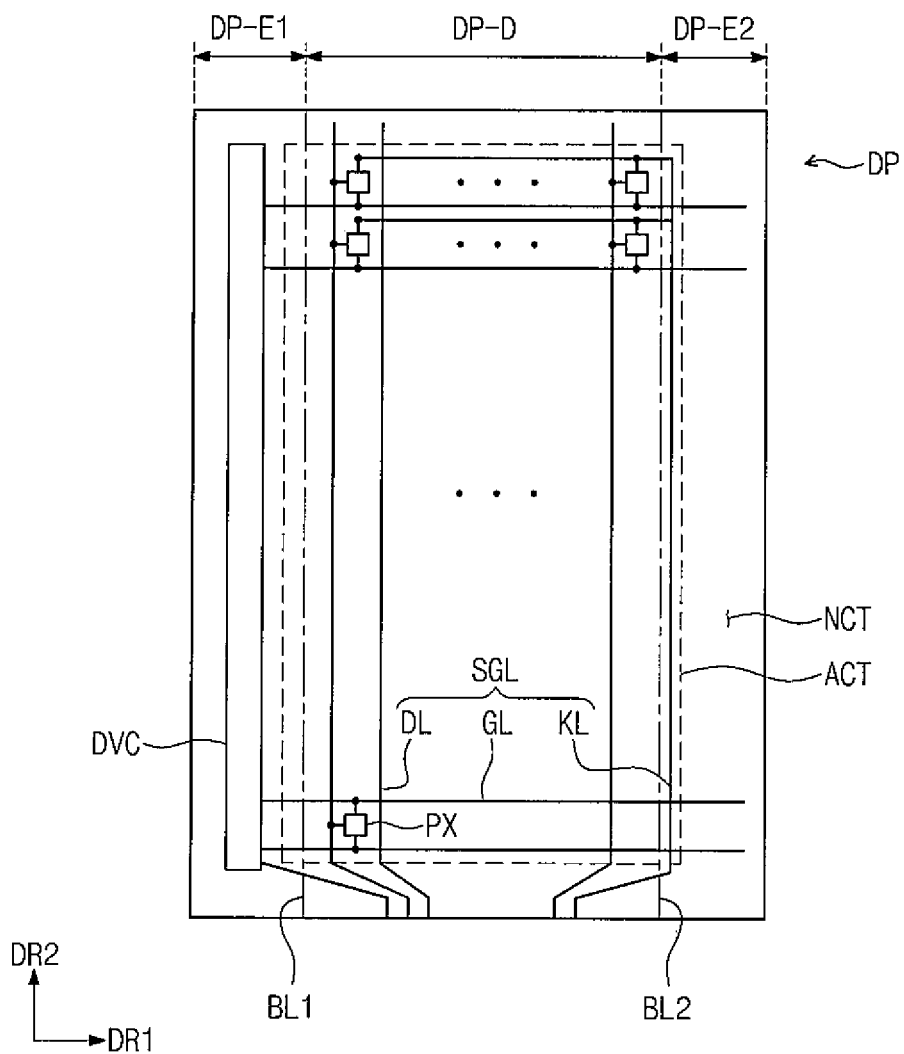
FIG. 5 is a plan view showing a display panel according to an exemplary embodiment of the present disclosure.
Figure 6:
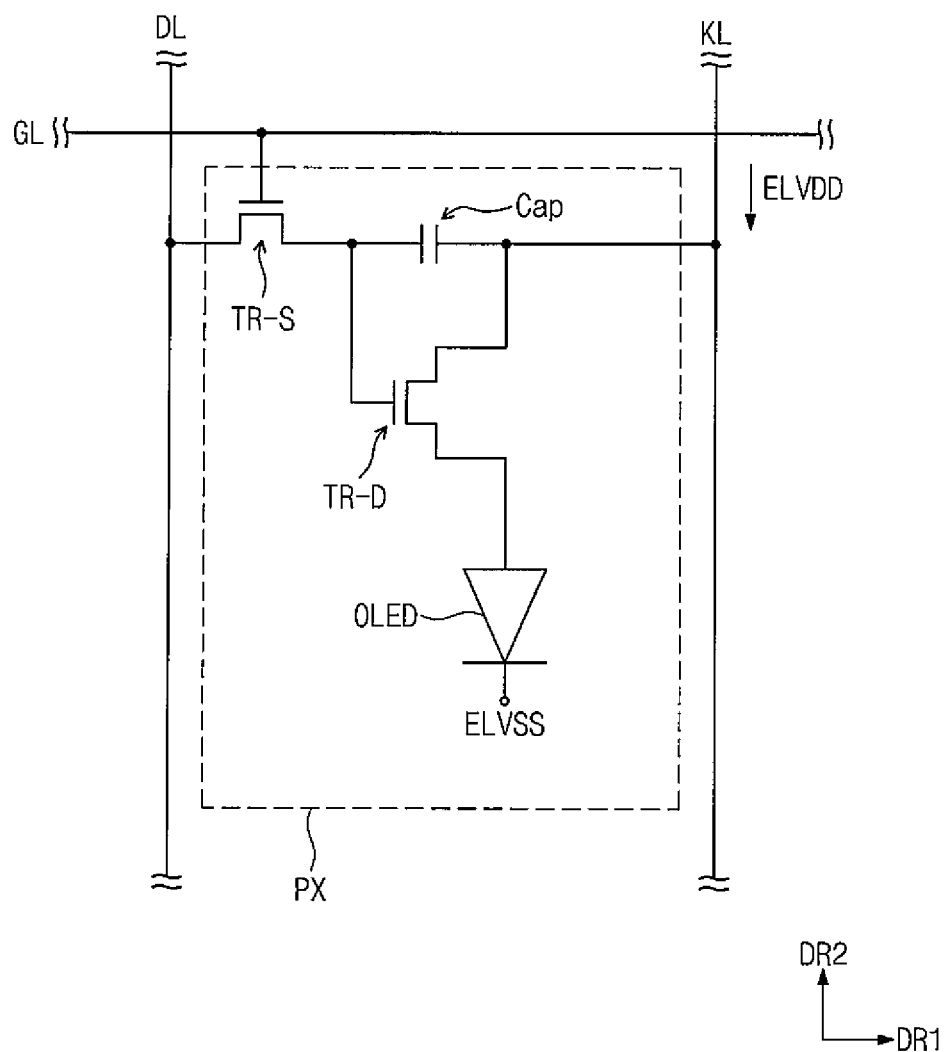
FIG. 6 is an equivalent circuit diagram showing a pixel according to an exemplary embodiment of the present disclosure.
Figure 7A:
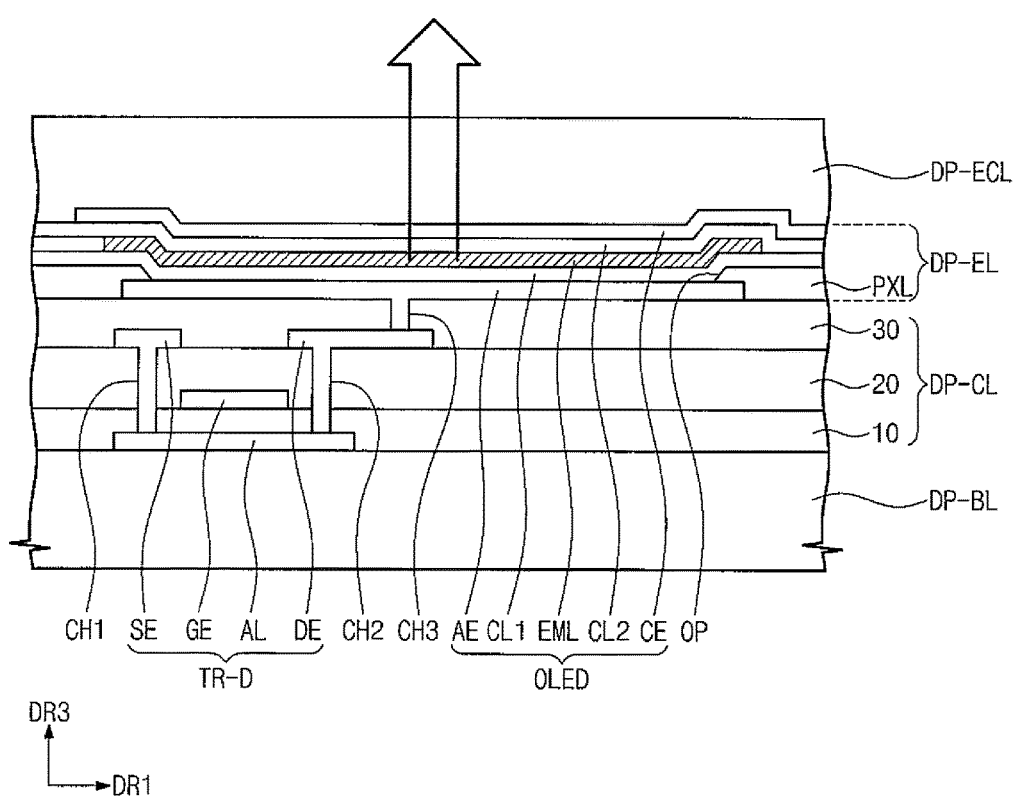
FIGS. 7A and 7B are cross-sectional views showing a pixel according to an exemplary embodiment of the present disclosure.
Figure 7B:
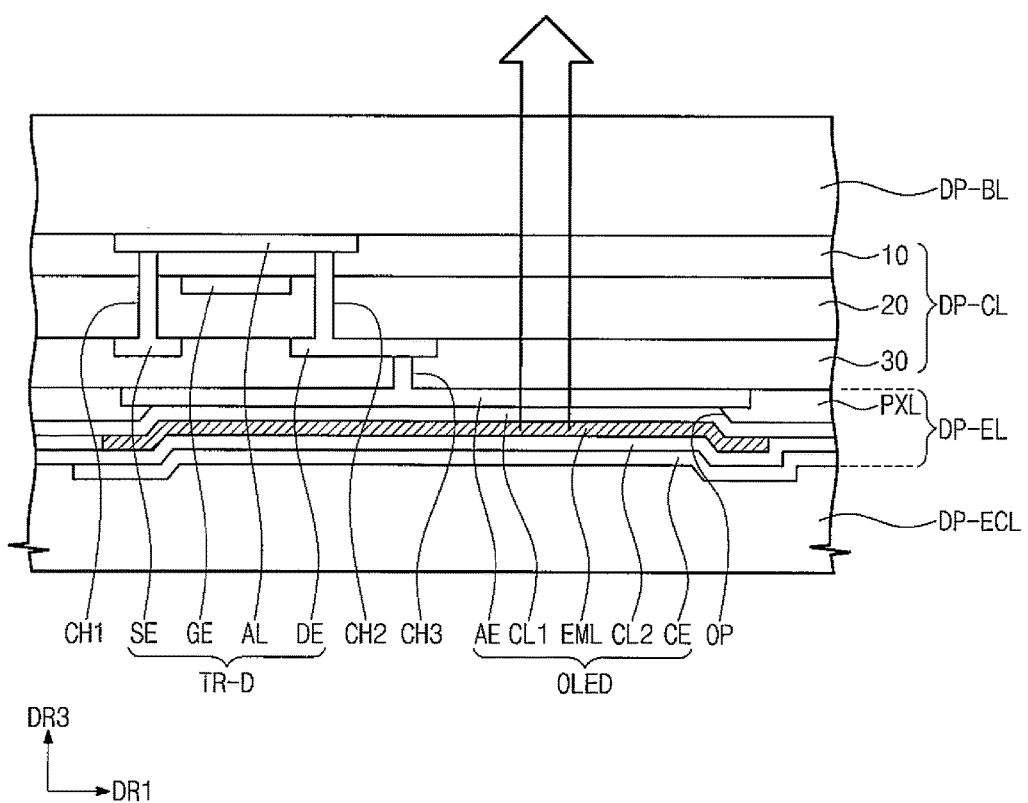

FIG. 4 is a perspective view showing the display panel DP according to an exemplary embodiment of the present disclosure, FIG. 5 is a plan view showing the display panel DP, which is not bent (e.g., the display panel DP before it is bent or curved), according to an exemplary embodiment of the present disclosure, FIG. 6 is an equivalent circuit diagram showing a pixel PX according to an exemplary embodiment of the present disclosure, and FIGS. 7A and 7B are cross-sectional views showing the pixel PX according to an exemplary embodiment of the present disclosure. Hereinafter, the display panel DP will be described in detail with reference to FIGS. 4 to 7B.

The display panel DP includes a plurality of signal lines SGL (see FIG. 5) and a plurality of pixels PX. The display panel DP is divided into the display part DP-D, the first edge part DP-E1, and the second edge part DP-E2 when the display module DM is assembled. The display panel DP may also be divided into an activation area ACT and an inactivation area NCT based on locations of the pixels PX (e.g., the pixel PX is located in the activation area ACT, and is not located in the inactivation area NCT). In the present exemplary embodiment, the inactivation area NCT is located along edges of the activation area ACT.

The first and second edge parts DP-E1 and DP-E2 are bent from the display part DP-D along a first bending axis BL1 and a second bending axis BL2, respectively. In FIGS. 4 and 5, the first and second bending axes BL1 and BL2 overlap the activation area ACT, although the present invention is not limited thereto or thereby. That is, the first and second bending axes BL1 and BL2 may overlap the inactivation area NCT.

The signal lines SGL include gate lines GL, data lines DL, and a power supply line KL. Each of the gate lines GL is connected to a corresponding pixel(s) of the pixels PX, and each of the data lines DL is connected to a corresponding pixel(s) of the pixels PX. A driving circuit DCV is located at one side of the inactivation area NCT and is connected to the gate lines GL.

FIG. 6 shows one gate line GL, one data line DL, and the pixel PX connected to the power supply line KL, but the configuration of the pixel PX should not be limited thereto or thereby.

The pixel PX includes an organic light emitting diode OLED as a display element thereof. The pixel PX includes a switching thin film transistor TR-S, a driving thin film transistor TR-D, and a capacitor Cap as a circuit to drive the organic light emitting diode OLED.

The switching thin film transistor TR-S outputs a data signal provided through the data line DL in response to a scan signal provided through the gate line GL. The capacitor Cap is charged with a voltage corresponding to the data signal provided from the switching thin film transistor TR-S.

The driving thin film transistor TR-D is connected to the organic light emitting diode OLED, and is configured to control a driving current flowing through the organic light emitting diode OLED in response to an amount of electric charge charged in the capacitor Cap. The organic light emitting diode OLED emits a light during a turn-on period of the driving thin film transistor TR-D.

The organic light emitting diode OLED may be a front surface light emitting type diode shown in FIG. 7A, or may be a rear surface light emitting type diode shown in FIG. 7B.

Referring to FIGS. 7A and 7B, a circuit layer DP-CL, an element layer (e.g., a display element layer) DP-EL, and an encapsulation layer DP-ECL are located on a base layer DP-BL. The base layer DP-BL includes at least one plastic film, and may include two plastic films, inorganic layers between the two plastic films, and a silicon nitride layer and/or a silicon oxide layer. The base layer DP-BL includes at least one of polyimide (PI), polyethylene terephthalate (PET), polyethylene naphthalate (PEN), polyethersulphone (PES), and fiber reinstressd plastics (FRP).

The circuit layer DP-CL includes a plurality of insulating layers 10, 20, and 30, and a plurality of conductive layers. The conductive layers of the circuit layer DP-CL form the switching thin film transistor TR-S, the driving thin film transistor TR-D, and the capacitor Cap.

A semiconductor pattern AL of the driving thin film transistor TR-D is located on the base layer DP-BL. A first insulating layer 10 is located on the base layer DP-BL to cover the semiconductor pattern AL. The first insulating layer 10 includes an organic layer and/or an inorganic layer. The first insulating layer 10 includes a plurality of thin film layers.

A control electrode GE of the driving thin film transistor TR-D is located on the first insulating layer 10. A second insulating layer 20 is located on the first insulating layer 10 to cover the control electrode GE. The second insulating layer 20 includes an organic layer and/or an inorganic layer. The second insulating layer 20 includes a plurality of thin film layers.

An input electrode (e.g., source electrode) SE and an output electrode (e.g., drain electrode) DE of the driving thin film transistor TR-D are located on the second insulating layer 20. The input electrode SE and the output electrode DE are connected to the semiconductor pattern AL respectively through first and second contact holes CH1 and CH2 formed through the first and second insulating layers 10 and 20. According to another embodiment, the driving thin film transistor TR-D may be embodied in a bottom gate structure.

A third insulating layer 30 is located on the second insulating layer 20 to cover the input electrode SE and the output electrode DE. The third insulating layer 30 includes an organic layer and/or an inorganic layer, and includes a plurality of thin film layers.

The element layer (e.g., display element layer) DP-EL is located on the third insulating layer 30, and includes a pixel definition layer PXL and the organic light emitting diode OLED. The organic light emitting diode OLED includes an anode AE, a hole control layer CL1, an organic light emitting layer EML, an electron control layer CL2, and a cathode CE. The anode AE is connected to the output electrode DE through a third contact hole CH3 formed through the third insulating layer 30.

The pixel definition layer PXL includes an opening OP formed therethrough to expose the anode AE. The hole control layer CL1 is provided in a single unit to commonly correspond to the pixels PX, or is provided as a plurality of units separated from each other to respectively correspond to the pixels PX. The hole control layer CL1 may include a hole injection layer and a hole transport layer.

The organic light emitting layer EML is located on the hole control layer CL1, and may be located only in an area corresponding to the opening OP. The electron control layer CL2 is located on the organic light emitting layer EML, and is either provided in a single unit to commonly correspond to the pixels PX, or provided as a plurality of units separated from each other to respectively correspond to the pixels PX. The electron control layer CL2 may include an electron injection layer and an electron transport layer. The cathode CE is located on the electron control layer CL2, and is located to commonly correspond to the pixels PX.

As shown in FIG. 7A, the front surface light emitting type organic light emitting diode OLED includes the anode AE having high reflectance, and the cathode CE having high transmittance. As shown in FIG. 7B, the rear surface light emitting type organic light emitting diode OLED includes the anode AE having high transmittance and the cathode CE having high reflectance.

The encapsulation layer DP-ECL is located on the cathode CE, and is located to commonly correspond to the pixels PX. The encapsulation layer DP-ECL overlaps with at least the activation area ACT. The encapsulation layer DP-ECL includes an organic layer and/or an inorganic layer, and may include alternately stacked silicon nitride layers and silicon oxide layers.

The dummy member DDM described with reference to FIGS. 2 and 3 may be attached on the encapsulation layer DP-ECL of the front surface light emitting type organic light emitting display panel DP shown in FIG. 7A. The dummy member DDM described with reference to FIGS. 2 and 3 may be attached on the base layer DP-BL of the rear surface light emitting type organic light emitting display panel DP shown in FIG. 7B.

Although not shown separately, the switching thin film transistor TR-S may have substantially the same structure as the driving thin film transistor TR-D. In addition, two electrodes of the capacitor Cap are respectively located on different insulating layers of the first, second, and third insulating layers 10, 20, and 30.

Figure 8:
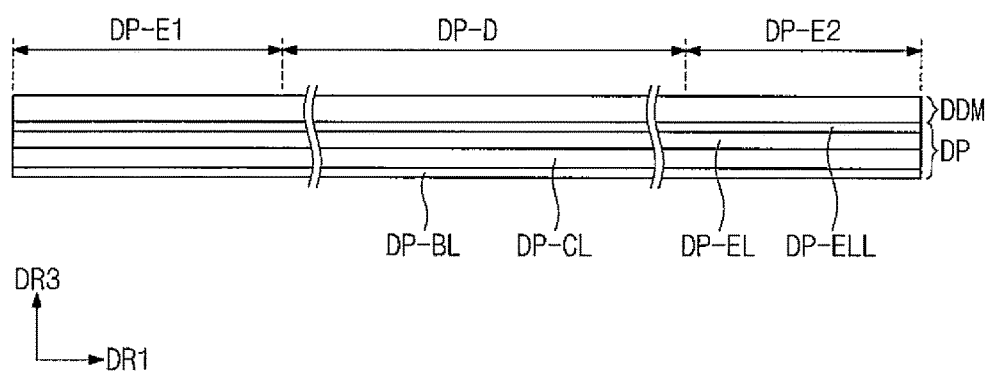
FIG. 8 is a cross-sectional view showing a display panel and a dummy member according to an exemplary embodiment of the present disclosure.
Figure 9:
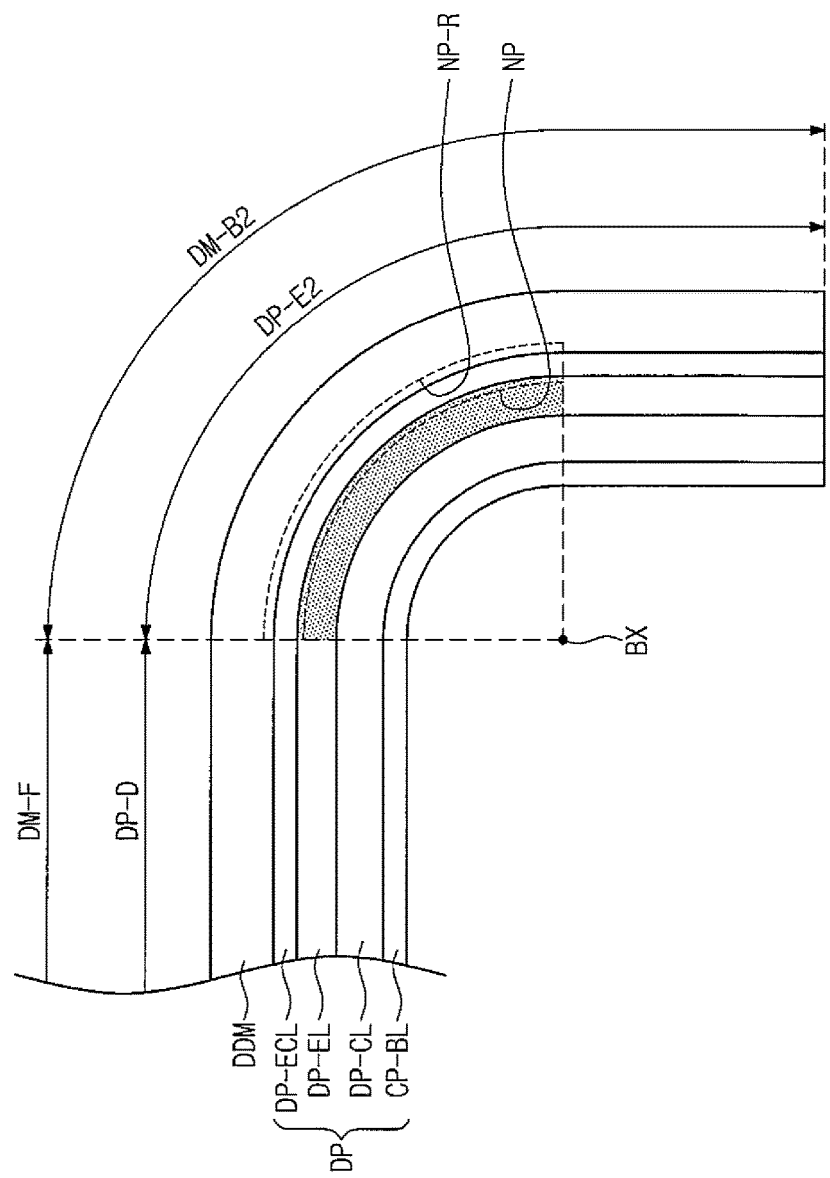
FIG. 9 is a view showing a neutral plane generated at an edge part of a display panel according to an exemplary embodiment of the present disclosure.
Figure 10:
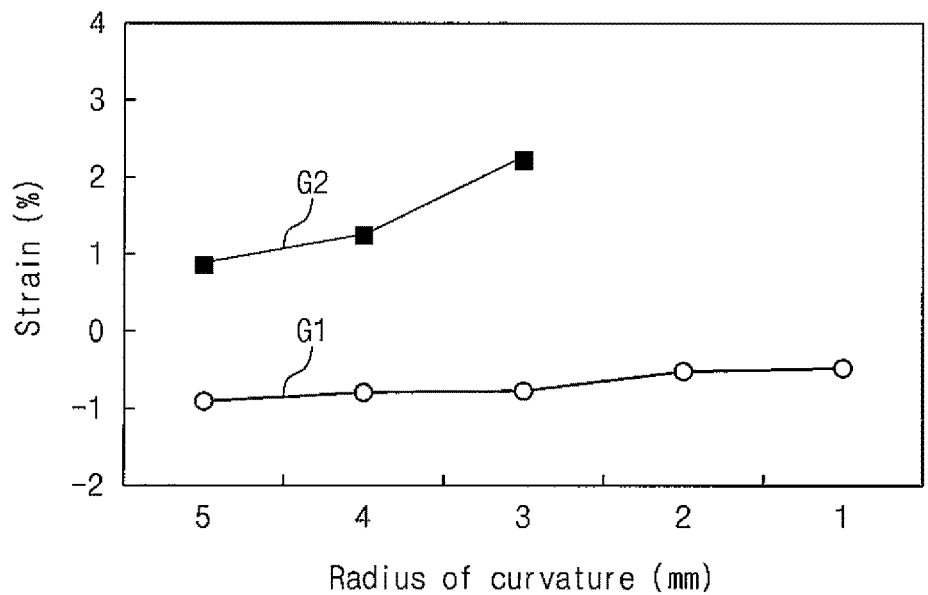
FIG. 10 is a graph showing a strain of a thin film transistor according to a radius of curvature of the edge part.

FIG. 8 is a cross-sectional view showing the display panel DP and the dummy member DDM according to an exemplary embodiment of the present disclosure, FIG. 9 is a view showing a neutral plane NP generated at the second edge part DP-E2 of the display panel DP according to an exemplary embodiment of the present disclosure, and FIG. 10 is a graph showing a strain of a thin film transistor according to a radius of curvature of the edge part.

FIG. 8 shows the display panel DP in a stretched state, which is described with reference to FIG. 7A. The display panel DP includes the base layer DP-BL, the circuit layer DP-CL, the element layer DP-EL, and the encapsulation layer DP-ECL. The dummy member DDM is located on the encapsulation layer DP-ECL.

FIG. 9 shows the neutral NP generated when the second edge part DP-E2 is bent. The neutral planes NP is generated on the second edge part DP-E2 when the display panel DP is bent along a bending axis BX. The neutral plane NP is a plane or curved surface in which a vector sum of tensile stress and compressive stress applied to the bent display panel DP becomes zero. No stress is applied to the neutral plane NP because the tensile stress and the compressive stress offset each other.

Due to the dummy member DDM, the neutral plane NP is adjacent the encapsulation layer DP-ECL. The neutral plane NP may be shifted when compared to a comparison example in which the dummy member DDM is omitted.

Because of the presence of the dummy member DDM, compressive stress is applied to the circuit layer DP-CL of the second edge part DP-E2, as opposed to tensile stress. In this case, the tensile stress is applied to a second bending part DM-B2 of the dummy member DDM. Although not shown separately, the compressive stress is applied to the circuit layer DP-CL of the first edge part DP-E1, and the tensile stress is applied to a first bending part DM-B1 of the dummy member DDM.

In the present exemplary embodiment, the neutral plane NP is shifted to an imaginary neutral plane NP-R as a thickness of the dummy member DDM becomes thicker. In other words, the neutral plane NP may be at the dummy member DDM. In this case, the circuit layer DP-CL of the first edge part DP-E1 and the circuit layer DP-CL of the second edge part DP-E2 experience compressive stress.

The thin film transistor TR-D included in the circuit layer DP-CL has higher durability against compressive stress than against tensile stress of the same intensity. FIG. 10 shows two simulated graphs G1 and G2. A first graph G1 shows the strain of the thin film transistor applied with the compressive stress and a second graph G2 shows the strain of the thin film transistor applied with the tensile stress. As the radius of curvature becomes smaller, the strain becomes higher. When the display module is folded at the radius of curvature of about 3 mm or more, the strain caused by the tensile stress is sufficient enough to break the thin film transistor. In contrast, the thin film transistor withstands the compressive stress generated when the radius of curvature is about 3 mm or more. According to the present exemplary embodiment, because the compressive stress (and not the tensile stress) is applied to the circuit layer 100-CL, the thin film transistor may be prevented from being damaged.

Figure 11:
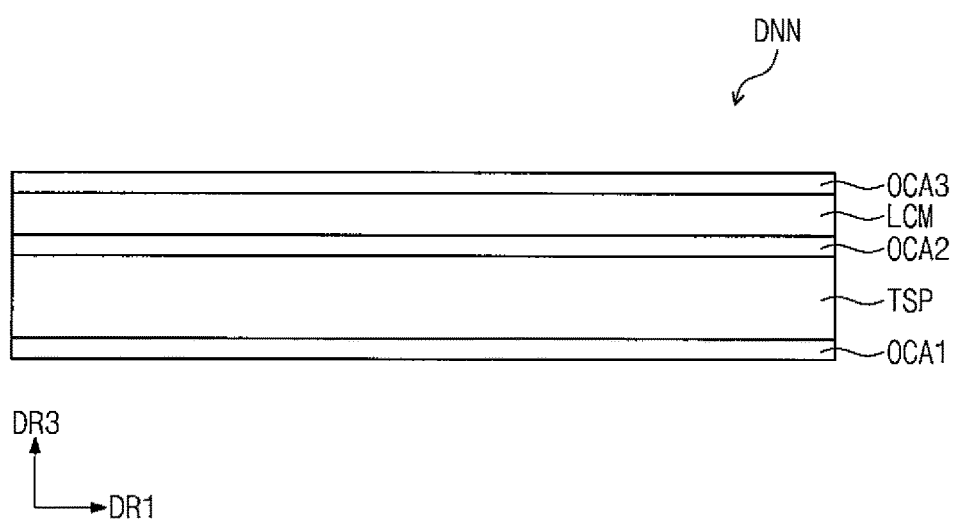
FIG. 11 is a cross-sectional view showing a functional member according to an exemplary embodiment of the present disclosure.

FIG. 11 is a cross-sectional view showing the functional member DNN according to an exemplary embodiment of the present disclosure. The functional member DNN may include at least a touch panel TSP, and may include an optical member LCM and optically clear adhesives OCA1, OCA2, and OCA3. The first and third optically clear adhesives OCA1 and OCA3 attach the functional member DNN to the window member WM and to the display panel DP. The second optically clear adhesive OCA2 attaches the touch panel TSP to the optical member LCM.

The touch panel TSP senses a touch event occurring on the front surface of the window member WM. The touch panel TSP may be, but is not limited to, a capacitive type of touch screen panel, a resistive type of touch screen panel, a sound touch screen panel, a piezoelectric touch screen panel, or an electromagnetic induction type of touch screen panel as long as the touch panel TSP senses the touch event generated by the user. According to the present exemplary embodiment, the dummy member DDM described with reference to FIGS. 1 to 10 may be replaced with the touch panel TSP.

The optical member LCM includes a polarization plate and a retardation plate. The polarization plate is located on the retardation plate. An external light entering from the outside of the window member WM is linearly polarized while passing through the polarization plate. The linearly-polarized incident light passes through the retardation plate, and is reflected by the display panel DP. The light reflected by the display panel DP passes again through the retardation plate, and is incident to the polarization plate. The external light has different phases in accordance with paths thereof. The external light may be canceled out because the external light might not pass through the polarization plate after being reflected by the display panel DP. Accordingly, the reflectance of the display module DM with respect to the external light is reduced.

Figure 12:
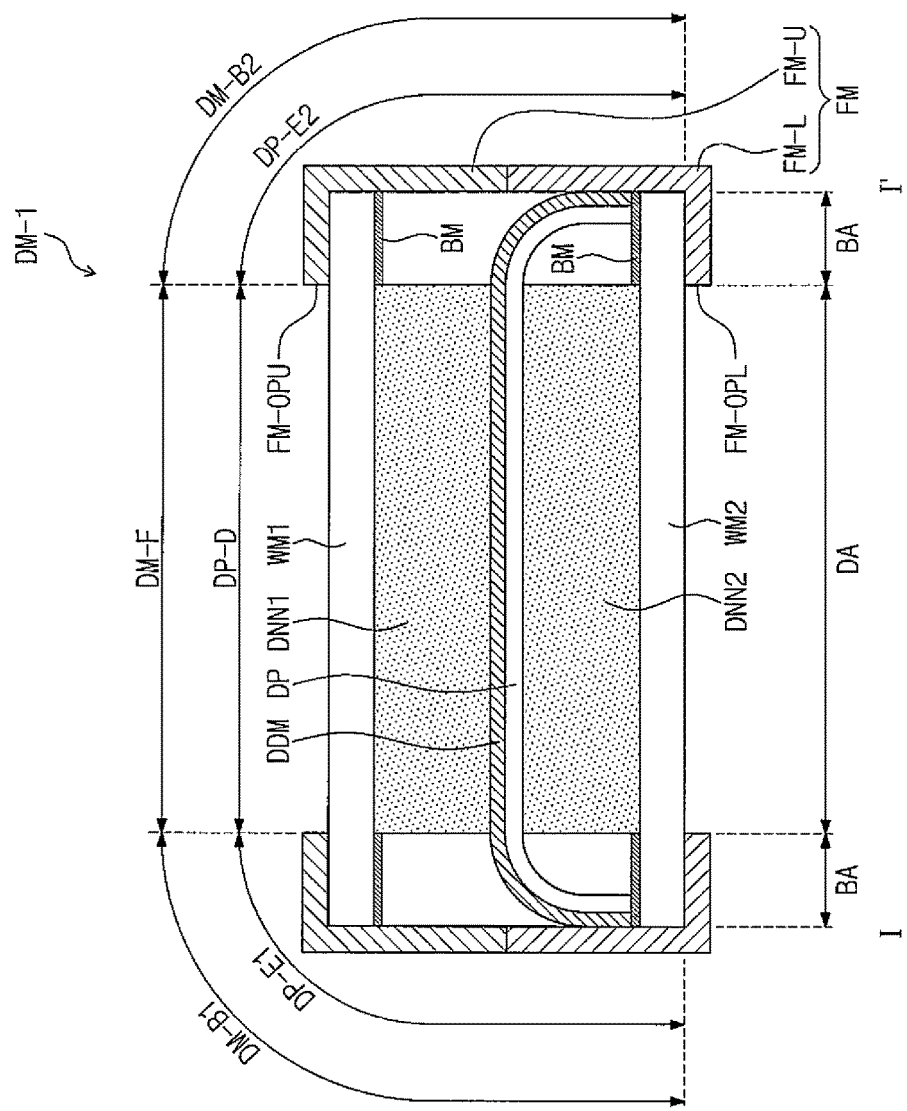
FIG. 12 is a cross-sectional view showing a display module according to an exemplary embodiment of the present disclosure.
Figure 13:
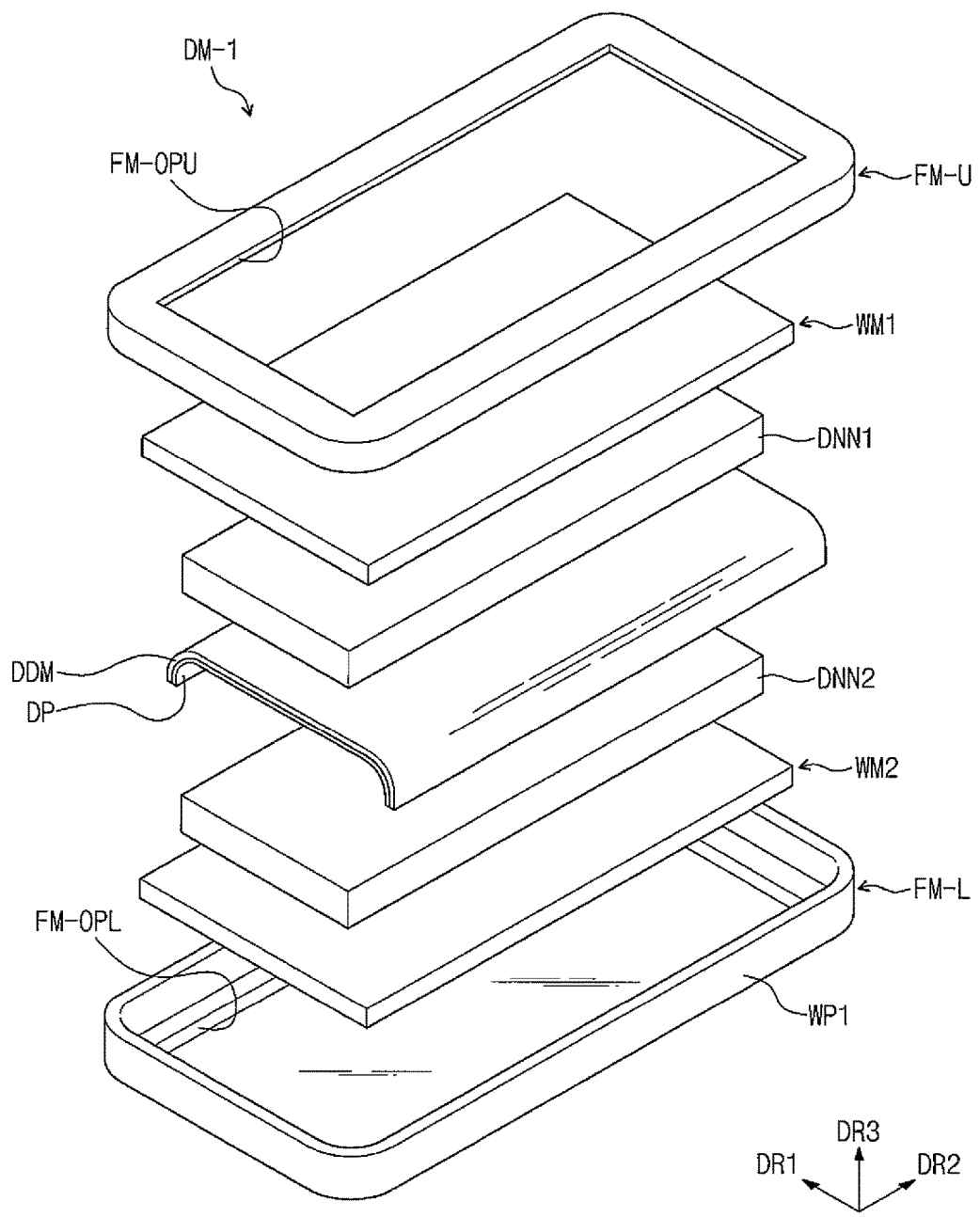
FIG. 13 is an exploded perspective view showing a display module according to an exemplary embodiment of the present disclosure.

FIG. 12 is a cross-sectional view showing a display module DM-1 according to an exemplary embodiment of the present disclosure, and FIG. 13 is an exploded perspective view showing the display module DM-1 according to an exemplary embodiment of the present disclosure. Hereinafter, the display module DM-1 will be described in detail with reference to FIGS. 12 and 13. In FIGS. 12 and 13, the same reference numerals denote the same elements in FIGS. 1 to 11, and thus detailed descriptions of the same elements will be omitted.

Referring to FIGS. 12 and 13, the display module DM-1 includes first and second window members WM1 and WM2, first and second functional members DNN1 and DNN2, a dummy member DDM, a display panel DP, and a protective frame FM. The display module DM-1 has a top and bottom symmetrical stack structure with respect to the display panel DP. In the present exemplary embodiment, one or more of the first and second functional members DNN1 and DNN2 and the dummy member DDM may be omitted.

The first and second window members WM1 and WM2 form display surfaces (e.g., an upper display surface, a lower display surface, etc.) of the display module DM. A black matrix layer BM is located at a portion of a rear surface of the first window member WM1, and at a portion of a front surface of the second window member WM2.

The first and second functional members DNN1 and DNN2 maintain separation between the dummy member DMM and the first window member WM1, and separation between the display panel DP and the second window member WM2, respectively. Each of the first and second functional members DNN1 and DNN2 includes at least one of a plastic film, a touch panel, and an optical member.

The protective frame FM accommodates the display panel DP. The protective frame FM includes an upper protective frame FM-U and a lower protective frame FM-L coupled thereto. The upper and lower protective frames FM-U and FM-L respectively expose the first and second window members WM1 and WM2 to the outside, and respectively include openings FM-OPU and FM-OPL.

In the present exemplary embodiment, the protective frame FM should not be limited to a specific shape as long as the protective frame FM protects the first and second window members WM1 and WM2, the first and second functional members DNN1 and DNN2, the dummy member DDM, and the display panel DP, which are stacked one on another, and as long as protective frame FM exposes the first and second window members WM1 and WM2.

Figure 14:
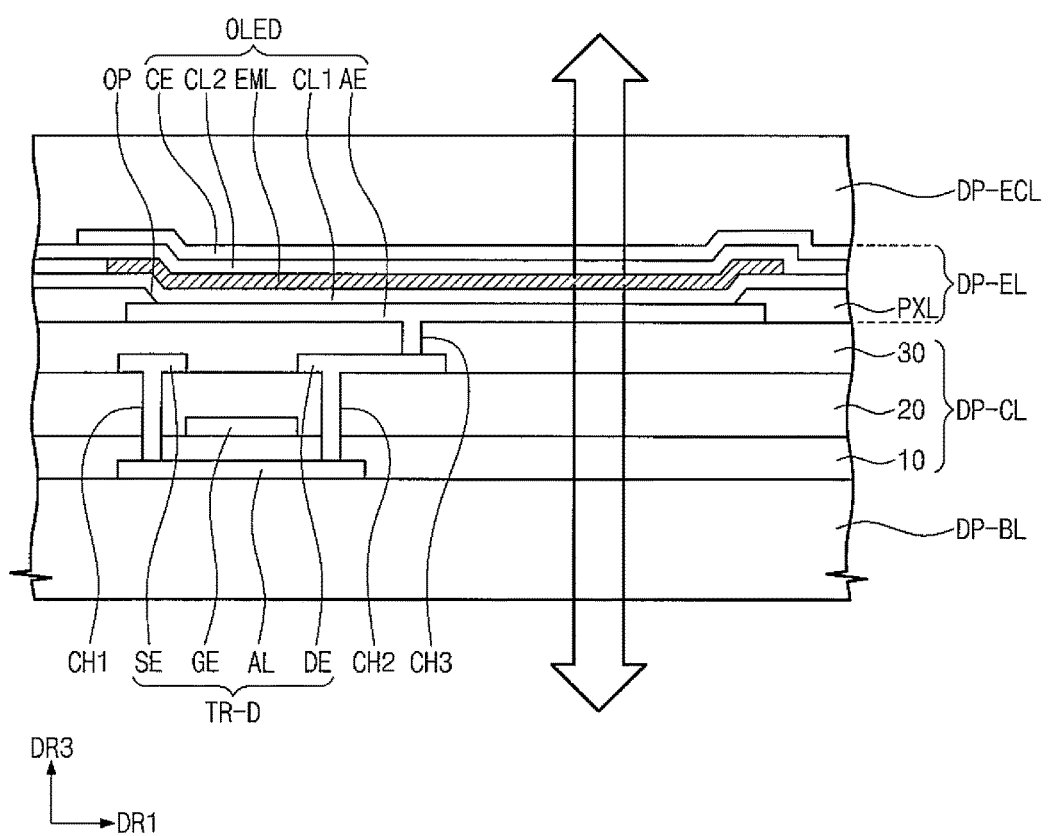
FIG. 14 is a cross-sectional view showing a pixel according to an exemplary embodiment of the present disclosure.
Figure 15A:
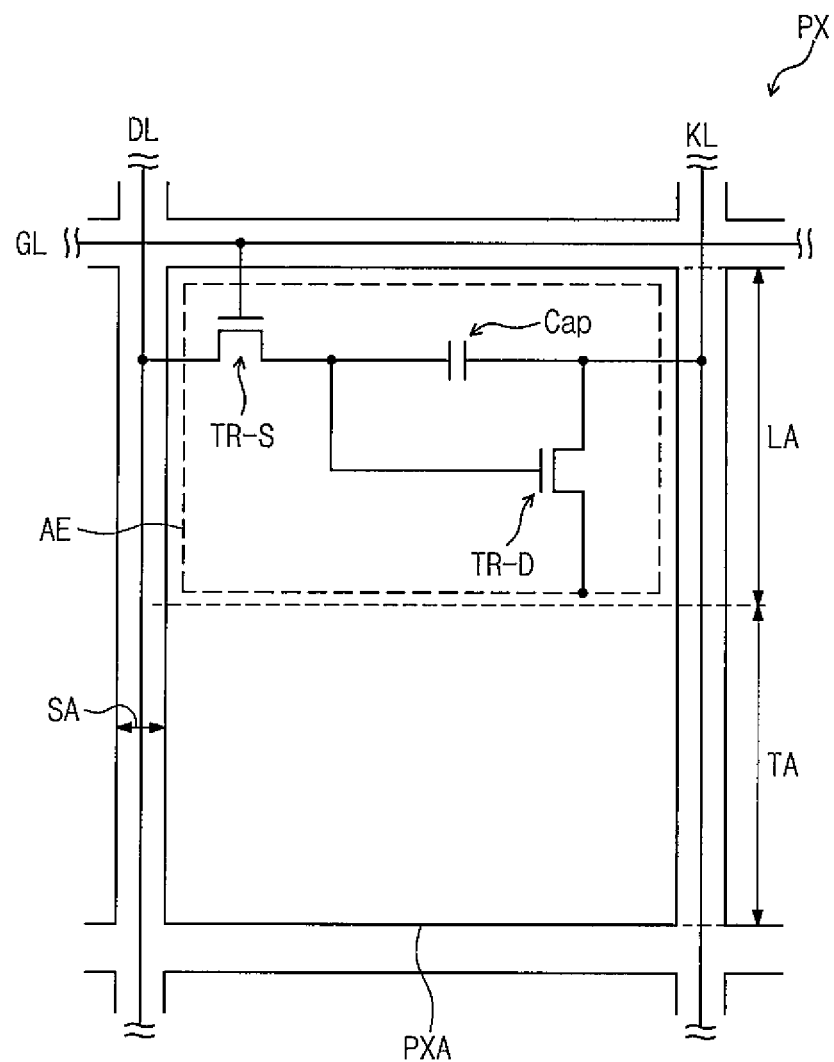
FIG. 15A is a plan view showing a pixel according to an exemplary embodiment of the present disclosure.
Figure 15B:
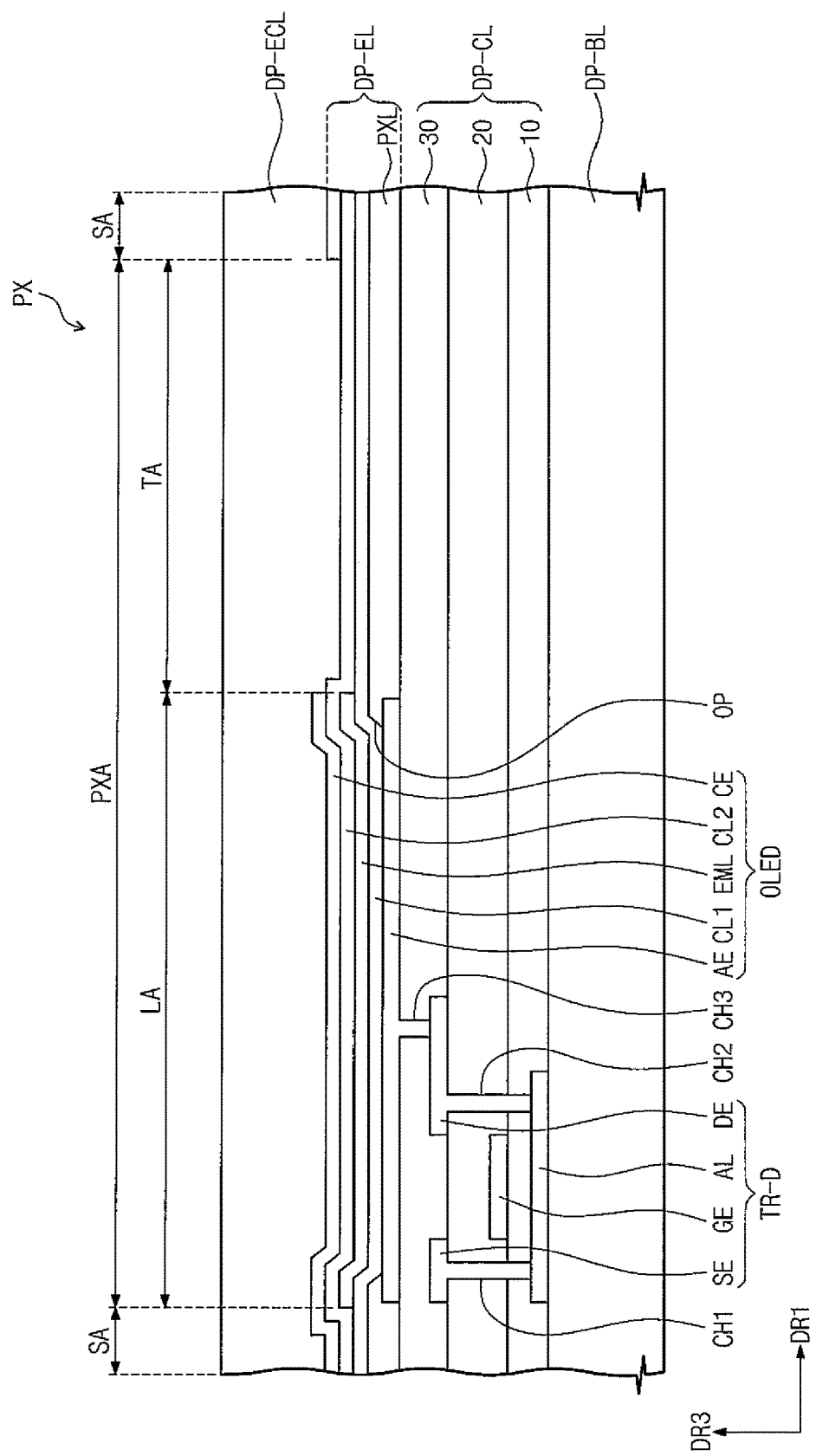
FIG. 15B is a cross-sectional view showing a pixel according to an exemplary embodiment of the present disclosure.

FIG. 14 is a cross-sectional view showing a pixel according to an exemplary embodiment of the present disclosure, FIG. 15A is a plan view showing a pixel according to an exemplary embodiment of the present disclosure, and FIG. 15B is a cross-sectional view showing a pixel according to an exemplary embodiment of the present disclosure.

In the present exemplary embodiment, the display panel DP may be, but is not limited to, a dual surface light emitting type organic light emitting display panel, or a transparent organic light emitting display panel.

Referring to FIG. 14, the display panel DP may be, but is not limited to, the dual surface light emitting type organic light emitting display panel. The organic light emitting diode OLED may emit the light to the two surfaces (i.e., the front and rear surfaces in the present embodiment). To this end, each of the cathode CE and the anode AE includes a conductive material having high transmittance. The light emitted from the organic light emitting diode OLED travels to the outside of the display panel DP after passing through the first and second window members WM1 and WM2 shown in FIGS. 12 and 13. Lights provided from the pixels PX form images.

In an alternative embodiment, each of the pixels PX of the dual surface light emitting type organic light emitting display panel may include the front surface light emitting type organic light emitting diode and the rear surface light emitting type organic light emitting diode, which are stacked along the third direction DR3. In the present exemplary embodiment, a portion of the pixels PX of the dual surface light emitting type organic light emitting display panel includes the front surface light emitting type organic light emitting diode, and another portion of the pixels PX of the dual surface light emitting type organic light emitting display panel includes the rear surface light emitting type organic light emitting diode. The front surface light emitting type pixels are alternately arranged with the rear surface light emitting type pixels. In the present exemplary embodiment, the dual surface light emitting type organic light emitting display panel should not be limited thereto or thereby.

Referring to FIGS. 15A and 15B, the display panel DP may be, but is not limited to, the transparent organic light emitting display panel. FIGS. 15A and 15B show a pixel area of only one pixel PX of the display panel DP. A portion of the pixel PX generates the light, and the other portion of the pixel PX transmits the external light.

When viewed in a plan view, the anode AE is located in a portion of the pixel area. The pixel area includes an element area LA and a transmission area TA. The light is generated in the element area LA. The transmission area TA transmits the external light because the anode AE is not located in the transmission area TA. The display panel DP may be the front surface light emitting type, the rear surface light emitting type, or the dual surface light emitting type in accordance with the transmittance and reflectance of the anode AE and the cathode CE.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display module comprising:
    a flat window member comprising a display area and a bezel area;
    a display panel configured to produce an image, and comprising a display part for producing the image and overlapping the display area, and an edge part overlapping the bezel area and bent from the display part to extend away from the flat window member;
    a dummy member on the display panel, and comprising:
      a flat part overlapping the display part; and
      a bending part overlapping the edge part; and
    a protective frame accommodating the display panel and coupled to the flat window member,
    wherein the edge part is bent in accordance with a first curvature from the display part, and
    wherein the bending part is bent in accordance with the first curvature from the flat part.

2. The display module of claim 1, wherein the edge part comprises:
    a first edge part bent from a first side of the display part; and
    a second edge part opposite the first edge part and bent from a second side of the display part.

3. The display module of claim 2, wherein the bending part comprises a first bending part corresponding to the first edge part, and a second bending part corresponding to the second edge part.

4. The display module of claim 3, wherein the display panel comprises:
    a base layer;
    a circuit layer on the base layer;
    a display element layer on the circuit layer; and
    an encapsulation layer on the display element layer.

5. The display module of claim 4, wherein each of the first and second edge parts comprises a neutral plane, and
    wherein the circuit layer at the first and second edge parts is applied with a compressive stress.

6. The display module of claim 5, wherein each of the first and second bending parts is applied with a tensile stress.

7. The display module of claim 4, wherein each of the first and second bending parts comprises a neutral plane, and
    wherein the circuit layer of the first and second edge parts is applied with a compressive stress.

8. The display module of claim 4, wherein the circuit layer comprises a thin film transistor.

9. The display module of claim 4, wherein the display element layer comprises an organic light emitting diode.

10. The display module of claim 1, further comprising a touch panel between the display panel and the flat window member.

11. The display module of claim 1, further comprising a support member between the display panel and the protective frame.

12. A display module comprising:
    a first flat window member comprising a display area and a bezel area;
    a display panel comprising a display part comprised of pixels overlapping the display area, and an edge part overlapping the bezel area and bent from the display part to extend away from the first flat window member; and
    a second flat window member facing the first flat window member and being spaced apart from the first flat window member such that the display panel is between the first and second flat window members,
    wherein the first and second flat window members are configured to concurrently display different respective images therethrough, the different images being produced by different, respective portions of the pixels.

13. The display module of claim 12, wherein the edge part comprises:
    a first edge part bent from a first side of the display part; and
    a second edge part opposite the first edge part and bent from a second side of the display part.

14. The display module of claim 13, further comprising a dummy member attached to the display panel and comprising a flat part corresponding to the display part, a first bending part corresponding to the first edge part, and a second bending part corresponding to the second edge part.

15. The display module of claim 14, wherein the display panel comprises:
    a base layer;
    a circuit layer on the base layer and comprising a thin film transistor;
    a display element layer on the circuit layer and comprising an organic light emitting diode; and
    an encapsulation layer on the display element layer.

16. The display module of claim 15, wherein each of the first and second edge parts comprises a neutral plane, and
    wherein the circuit layer of the first and second edge parts is applied with a compressive stress.

17. The display module of claim 15, wherein each of the first and second bending parts comprises a neutral plane, and
    wherein the circuit layer of the first and second edge parts is applied with a compressive stress.

18. The display module of claim 15, wherein the organic light emitting diode provides light to the first and second flat window members.

19. The display module of claim 12, further comprising a first touch panel between the display panel and the first flat window member.

20. The display module of claim 12, further comprising a second touch panel between the display panel and the second flat window member.

21. The display module of claim 1, wherein the edge part has a same top surface and a same bottom surface as the display part.

* * * * *